United States Patent
Amanai

[19]

[11] Patent Number: 6,128,230
[45] Date of Patent: Oct. 3, 2000

[54] SEMICONDUCTOR MEMORY WITH PN JUNCTION POTENTIAL REDUCTION IN A WRITING MODE

[75] Inventor: Masakazu Amanai, Tokyo, Japan

[73] Assignee: NEC Corporation, Tokyo, Japan

[21] Appl. No.: 09/280,666

[22] Filed: Mar. 29, 1999

[30] Foreign Application Priority Data

Mar. 27, 1998 [JP] Japan .................................. 10-081344

[51] Int. Cl.⁷ .................................................. G11C 11/34
[52] U.S. Cl. .................. 365/185.23; 365/185.04
[58] Field of Search ........................... 365/185.23, 185.04

[56] References Cited

U.S. PATENT DOCUMENTS

| | | | |
|---|---|---|---|
| 4,769,787 | 9/1988 | Furusawa et al. | 365/184 |
| 5,253,200 | 10/1993 | Arakawa | 365/185.23 |
| 5,680,349 | 10/1997 | Atsumi et al. | 365/185.23 |

FOREIGN PATENT DOCUMENTS 0 606 650 A2 7/1994 European Pat. Off. .
0 869 509 A2 10/1998 European Pat. Off. .

OTHER PUBLICATIONS

Umezawa, et al., A 5-V-Only Operation 0.6-μm Flash EEPROM with Row Decoder Scheme in Triple-Well Structure, 11/92, vol. 27, No. 11, pp. 1540–1545.

*Primary Examiner*—David Nelms
*Assistant Examiner*—M. Tran
*Attorney, Agent, or Firm*—Foley & Lardner

[57] ABSTRACT

A semiconductor memory device includes a plurality of memory cells, a row sub-decoder, a row main decoder and reducing means. The memory cells are arranged in a matrix form. The row sub-decoder selects each row of the memory cells. The row main decoder decodes a row address signal and supplies a control signal into the row sub-decoder. The row main decoder is structured by at least one transistor having a PN junction breakdown voltage. The reducing means reduces the PN junction breakdown voltage during a writing mode.

15 Claims, 7 Drawing Sheets

| NAME OF SIGNAL | DURING WRITING MODE | | | DURING ERASING MODE | | DURING READING MODE | |
|---|---|---|---|---|---|---|---|
| | WORD-LINE SELECTION | WORD-LINE NON-SELECTION | | WORD-LINE SELECTION | WORD-LINE NON-SELECTION | WORD-LINE SELECTION | WORD-LINE NON-SELECTION |
| XSPP1~n | -9V | 0V | 0V or -9V | 11V | 11V | VDD | 0V |
| XB | 5V | 5V | -9V | 11V | 0V | VDD | 0V |
| $\overline{XB}$ | -9V | -9V | 5V | 0V | 11V | 0V | VDD |
| WL1~n | -9V | 0V | | 11V | 0V | VDD | 0V |
| VPX | 5V | | | 11V | | VDD | |
| VBB | -9V | | | 0V | | 0V | |
| PBG | 0V | | | 11V | | VDD | |
| NBG | -9V | | | 0V | | 0V | |

FIG. 2
RELATED ART

| NAME OF SIGNAL | DURING WRITING MODE | | DURING ERASING MODE | | DURING READING MODE | |
|---|---|---|---|---|---|---|
| | WORD-LINE SELECTION | WORD-LINE NON-SELECTION | WORD-LINE SELECTION | WORD-LINE NON-SELECTION | WORD-LINE SELECTION | WORD-LINE NON-SELECTION |
| XSPP1~n | -9V | 0V 0V or -9V | 11V | 11V | VDD | 0V |
| XB | VDD | -9V | 11V | 0V | VDD | 0V |
| $\overline{XB}$ | -9V | VDD | 0V | 11V | 0V | VDD |
| WL1~n | -9V | 0V | 11V | 0V | VDD | 0V |
| VPX | VDD | | 11V | | VDD | |
| VBB | -9V | | 0V | | 0V | |
| PBG | 0V | | 11V | | VDD | |
| NBG | -9V | | 0V | | 0V | |

FIG. 5

| NAME OF SIGNAL | DURING WRITING MODE | | | DURING ERASING MODE | | | DURING READING MODE | |
|---|---|---|---|---|---|---|---|---|
| | WORD-LINE SELECTION | WORD-LINE NON-SELECTION | WORD-LINE NON-SELECTION | WORD-LINE SELECTION | WORD-LINE NON-SELECTION | WORD-LINE NON-SELECTION | WORD-LINE SELECTION | WORD-LINE NON-SELECTION |
| XSPP1~n | -9V | 0V | 0V or -9V | 11V | 11V | 11V | VDD | 0V |
| XB | 0V | 0V | -9V | 11V | 0V | 0V | VDD | 0V |
| $\overline{XB}$ | -9V | -9V | 0V | 0V | 11V | 11V | 0V | VDD |
| WL1~n | -9V | 0V | 0V | 11V | 11V | 0V | VDD | 0V |
| VPX1 | VDD | | | | 11V | | VDD | |
| VPX2 | 0V | | | | 11V | | VDD | |
| VBB1 | -4V | | | | 0V | | 0V | |
| VBB2 | -9V | | | | 0V | | 0V | |
| PBG | 0V | | | | 11V | | VDD | |
| NBG | -9V | | | | 0V | | 0V | |

FIG. 7

SEMICONDUCTOR MEMORY WITH PN JUNCTION POTENTIAL REDUCTION IN A WRITING MODE

BACKGROUND OF THE INVENTION

This invention relates to a semiconductor memory device, and in particular, to a semiconductor memory device, such as, a flash memory.

First, description will be made about a related semiconductor memory device with reference to FIG. 1.

As illustrated in FIG. 1, a related semiconductor memory device, such as, a flash memory or an EEPROM (Electrically Erasable Programmable ROM), includes a plurality of memory cells MC1–MCn, row sub-decoders (namely, word line driving circuits) SD, and a plurality of row main decoders MD. Herein, it is to be noted that only one decoder MD is illustrated in FIG. 1 for convenience.

In this event, each memory cell MC1–MCn is electrically writable and erasable, and each row sub-decoder SD selects a row of each memory cell MC1–MCn. Further, each row main decoder MD decodes a row address signal and supplies output signals XB, $\overline{XB}$ to the row sub-decodes SD.

In this case, the row main decoder is composed of two stages of level shift circuits 15, 16 and the output signals XB and $\overline{XB}$ thereof are complementary to each other.

Herein, a memory cell array is structured by a plurality of memory cells arranged in a matrix form. With such a structure, a plurality of word lines WL are connected to control gates of the respective memory cells arranged in the row direction while a plurality of bit lines BL are connected to drains of the respective memory cells arranged in the row direction. In this event, a plurality of word lines WL are divided into some blocks, and each block is selected by one of the row main decoders MD.

The row sub-decoder SD for selecting the row of the memory cell MC1 is composed of one p-channel transistor P11 and two of n-channel transistors N11, N12. In this case, sources of the transistor P11 and the transistor N11 are connected to an XSPP node which is given a pre-decode signal (XSPP) while a source of the transistor N12 is coupled to a ground terminal (GND).

Drains of the respective transistors P11, N11, N12 are connected to the word line (WL). Further, the output signal $\overline{XB}$ is given to gates of the transistor P11 and the transistor N12 while the output signal $\overline{XB}$ is given to a gate of the transistor N11.

Moreover, a back gate of the transistor P11 is coupled to a back gate voltage (PBG) node while back gates of the both transistors N11, N12 are connected to a back gate voltage (NBG) node, respectively.

Each of the row sub-decoders for driving the other memory cells MC2–MCn is structured by the respective transistors Pn1, Nn1, Nn2 in the same manner. These row sub-decoders are controlled by the pre-decode signals XSPP and the output signals XB, $\overline{XB}$ to determine potential of each word line (WN).

As will be described later, potential difference between the drain of each transistor P11, N11, N12 and the back gate often becomes high during a writing operation or an erasing operation. In this case, when a threshold value Vt of each transistor is lowered, leak current often flows because of sub-threshold or punch-through phenomenon. To prevent this, the back gate voltage of each transistor P11, N1, N12 is switched in accordance with an operation mode.

A first level shift circuit 15 is composed of two pairs of transistors which are connected between a mode switching power supply (VPX) node and a ground node in series. More specifically, the level shift circuit 15 is composed of a p-channel transistor PM1 and an n-channel transistor NM1, and a p-channel transistor PN2 and an n-channel transistor NM2.

With such a structure, an output of a NAND gate 13 is given to a gate of the transistor NM1 while an output of an inverter circuit 14 is given to a gate of the transistor NM2. Further, a series connection point between the transistor PM1 and the transistor NM1 is coupled to a gate of the transistor PM2 while a series connection point between the transistor PM2 and the transistor NM2 is coupled to a gate of the transistor PM1.

Subsequently, description will be made about an operation of the first level shift circuit 15.

When an output of the NAND gate 13 is equal to 0V, an output of the inverter 14 becomes VDD to turn on the transistor NM2. Thereby, the drain of the transistor NM2 and the gate of the transistor PM1 are put into 0V, respectively.

In consequence, the transistor PM1 is turned on, and the drain of the transistor PM1 and the gate of the transistor PM2 are put into VPX. At this time, the transistors NM1 and PM2 are turned off.

Conversely, when the output of the NAND gate 13 is equal to VDD, the output of the inverter 14 becomes 0V. Thereby, the transistor NM1 is turned on, and the gate of the transistor PM2 is put into 0V. In consequence, the transistor PM2 is turned on, and the gate of the transistor PM1 becomes VPX. At this time, the transistors NM2 and PM1 are turned off.

Thus, the first level shift circuit 15 converts the binary signal of [0V, VDD] as the output of the NAND gate 13 into the binary signal [0V, VPX].

On the other hand, a second level shift circuit 16 is composed of two pairs of transistors which are connected between a VPX node and a mode switching power supply voltage (VBB) in series. More specifically, the second level shift circuit 16 is composed of a transistor PM3 and a transistor NM3, and a transistor PM4 and a transistor NM4.

With this structure, the output is given to the gate of the transistor PM3 from a series connection point between the transistor PM2 and the transistor NM2. Further, the output is given to the gate of the transistor PM4 from a series connection point between the transistor PM1 and the transistor NM1.

Moreover, a series connection point between the transistor PM3 and the transistor NM3 is connected to the gate of the transistor NM4 while a series connection point between the transistor PM4 and the transistor NM4 is connected to the gate of the transistor NM3.

Subsequently, description will be made about an operation of a second level shift circuit 16.

When the output of the NAND gate is equal to 0V, the drain of the transistor NM2 is becomes 0V. Thereby, the transistor PM4 is tuned on to put the output signal $\overline{XB}$ into VPX. Consequently, the gate of the transistor NM3 becomes VPX, and the transistor NM3 is turned on to put the output signal XB into VBB. At this time, the transistors NM4 and PM3 are turned off.

Conversely, the output of the NAND gate 13 is equal to VDD, the drain of the transistor NM1 becomes 0 V. Thereby, the transistor PM3 is turned on to put the output signal XB into VPX. In Consequence, the gate of the transistor NM4 becomes VPX. As a result, the transistor NM4 is turned on to put the output signal $\overline{XB}$ into VBB. At this time, the transistors NM3 and PM4 are turned off.

Thus, the second level shift circuit 16 converts the binary signal of [0V, VPX] as the output of the first level shift circuit 15 into the binary signal of [VBB, VPX].

As mentioned before, the output signal $\overline{XB}$ is produced from the series connection point between the transistor PM3 and the transistor NM3 of the second level shift circuit 16 while the output signal $\overline{XB}$ is produced from the series connection point between the transistor PM4 and the transistor NM4. In this event, the output signals XB and $\overline{XB}$ are in the complementary relationship.

In this case, each voltage of each terminal in each operation mode of the row decoder illustrated in FIG. 1 is represented in FIG. 2.

Herein, it is assumed that the row main decoder MD illustrated in FIG. 1 is selected by the row address to select the word line WL1, and the word lines WL2–WLn and the row main decoders (not shown) are not selected.

With this example, description will be made about an operation of the row decoder MD, SD illustrated in FIG. 1.

In the writing operation, the mode switching power supply voltage VPX and the node switching power supply voltage VBB of the low potential side, which are applied to the row main decoder MD, are 5V and −9 V, respectively, as illustrated in FIG. 2. Further, the back gate voltage PBG of the p-channel transistor is equal to 0V while the back gate voltage NBG of the n-channel transistor is equal to −9 V.

When the output of the address decoder 13 becomes 0V, the output signal XB becomes a supply voltage 5V, and the output signal $\overline{XB}$ becomes −9 V. Further, the pre-decode signal XSPP1 is put into −9 V while XSPP2–n become 0V. Consequently, the transistor N11, and P21–Pn1 are turned on. As a result, the word line signal WL1 is put into −9 V while all of the word lines WL2–WLn are put into 0V.

In this event, the pre-decode signal XSPP1 of the memory block (not shown), which is not selected, becomes −9 V. However, the output signal XB becomes −9 V, and the output signal $\overline{XB}$ becomes the supply voltage 5V. Consequently, the transistors N12–Nn2 are turned on, and all of the word line signals WL1–WLn of non-selective blocks becomes 0V.

During the erasing operation, the mode switching power supply voltage VPX and the back gate voltage PBG is equal to 1 V, respectively. Further, the mode switching power supply voltage VBB at the low potential side and the back gate voltage NBG is equal to 0 V, respectively.

Moreover, the respective pre-decode signals XSPP1–n and the output signal XB are equal to 11 V, respectively while the output signal $\overline{XB}$ is equal to 0 V. As a result, the transistors P11–Pn1 are turned on, and the word line signals WN1–WLn are equal to 11V, respectively.

In this event, the pre-decode signals XSPP1–n of the non-selective memory blocks (not shown) are equal to 11V. However, the output of the address decoder 13 becomes VDD. Further, the output signal XB is put into 0V, and the output signal $\overline{XB}$ is put into 11V. Consequently, the transistors N12–Nn2 are turned on, and all of the word line signals WL1–WLn of the non-selective blocks becomes 0V.

During the reading operation, the mode switching power supply voltage VPX and the back gate voltage PBG become the power supply voltage, respectively. Further, the mode switching power supply voltage VBB at the lower potential side and the back gate voltage are equal to 0V, respectively.

When the output of the address decoder 13 becomes 0 V, the output signal XB becomes the supply voltage VDD and the output signal $\overline{XB}$ becomes 0 V. Further, the pre-decode signal XSPP1 is put into VDD while XSPP2–n are equal to 0 V, respectively. In consequence, the transistors P11, N21–Nn1 are turned on. Thereby, the word line signal WL1 is put into VDD while WL2–n are equal to 0V, respectively.

In this case, the pre-decode signal XSPP1 of the non-selective memory blocks (not shown) becomes VDD. However, the output of the address decoder 13 becomes VDD and the output signal XB is equal to 0V. Further, the output signal $\overline{XB}$ becomes the supply voltage VDD. Consequently, the transistors N12–Nn2 are turned on, and the word line signals WL1–WLn of the non-selective blocks become 0V, respectively.

Thus, the output signals $\overline{XB}$, XB of the row main decoder MD for controlling the word line driving circuit SD becomes 5V at the high level and −9 V at the low level during the writing operation in the row decoder RD arranged for the flash memory. As a result, a high voltage of 5−(−9)=14V is applied to a PN junction of the transistor constituting the level shift circuit MD.

Namely, the back gate potential (NBG) of the transistor N12 constituting the word line driving circuit SD is put into −9V during the writing operation. Thereby, the threshold voltage becomes, for example, about 3.5 V because of the back gate bias effect.

To this end, it is necessary that the gate potential of the transistor N12 is selected to a higher value than 3.5 V to put the potential of the word line (WL) into 0 V by turning on the transistor N12.

Previously, no problem occurs because the supply power source VDD is used as VPX, and VDD is set to about 5V.

Recently, the supply power source VDD trends to become lower between 1.8 and 3.6V. When the semiconductor memory device is used with the low power supply voltage, the output voltage $\overline{XB}$ does not satisfy the threshold voltage of the transistor N12. Consequently, the transistor N12 is not turned on.

As illustrated in FIG. 3, a voltage of 14 V is applied between an N+ region and a P-well of a high voltage (a high breakdown voltage) of the transistor, and between a P+ region and a deep N-well. Consequently, it is necessary that the breakdown level of the PN junction is designed to (14+α)V. Herein, the deep well prevents the current from flowing across the junction portion when a negative potential is applied to a P-substrate (GND).

Therefore, it is necessary to form a diffusion layer having lower impurity concentration than a diffusion layer which forms source and drain of the transistor for supplying the supply voltage VDD, such as, the power supply voltage.

Consequently, two steps, namely, the formation step of the thin P-type diffusion layer and the formation step of the thin N-type diffusion layer additionally become necessary. This means that the number of the manufacturing steps and the manufacturing cost are increased.

In the meanwhile, disclosure has been made about a conventional non-volatile semiconductor memory for preventing a large electric field stress from being applied to a gate insulating film of a transistor in Japanese Unexamined Patent Publication No. Hei. 9-17189.

In such a non-volatile semiconductor memory (EEPROM), a row main decoder and a low sub-decoder are arranged in accordance with a plurality of cell-blocks.

In this case, the low sub-decoder includes a PMOS transistor which is inserted and connected between an input node of the cell-block and a word line, and an NMOS transistor for pull-down which is connected to the word line and a ground node.

On the other hand, the row main decoder produces a plurality of control signals of which potentials are restricted in accordance with during erasing selection/writing non-selection of the cell block and during erasing non-selection/writing selection, and supplies the respective control signals to the gate of the PMOS transistor and NMOS transistor of the row-sub decoder.

This EEPROM prevents the large electric filed from being applied to the gate insulating film of the specific transistor in the row sub-decoder during writing and erasing. In consequence, reduction of reliability can be avoided.

However, no consideration is taken about a negative voltage in the above-mentioned non-volatile semiconductor memory (EEPROM), Further, the non-volatile semiconductor device is not applicable for the semiconductor memory device, such as, the flash memory. In semiconductor memory device, applied voltages to be applied to the memory cells during the writing operation are different from each other.

SUMMARY OF THE INVENTION

It is therefore an object of this invention to provide a semiconductor memory device which does not increase manufacturing cost by reducing breakdown level of a PN-junction without an additional manufacturing step even when an applied voltage to be applied to a memory cell during a writing operation is a negative voltage.

According to this invention, a semiconductor memory device includes a plurality of memory cells, a row sub-decoder, a row main decoder and reducing circuit.

In this event, the memory cells are arranged in a matrix form. The row sub-decoder selects each row of the memory cells. Further, the row main decoder decodes a row address signal and supplies a control signal into the row sub-decoder. Herein, the row main decoder is structured by at least one transistor having a PN junction breakdown voltage.

Moreover, the reducing circuit reduces the PN junction breakdown voltage during a writing mode. In this case, each of the memory cells is electrically writable and erasable.

With such a structure, a pre-decode signal is given to the row sub-decoder and is supplied to the memory cell via a word line. The reducing circuit sets a potential of the word line to a ground potential.

In this case, the reducing circuit is placed in the row sub-decoder and is structured by at a transfer gate. The transfer gate is composed of at least one p-channel transistor.

Further, the row sub-decoder has a ground potential node. The p-channel transistor is connected between the word line and the ground potential node. Specifically, the p-channel transistor has a source, a drain and a gate. In this condition, the source is connected to the ground potential node while the drain is connected to the word line. In addition, the control signal is given to the gate from the row main decoder.

Moreover, the control signal has predetermined amplitude, and the predetermined amplitude falls within the range between a zero potential and a negative potential.

The row main decoder is composed of at least one level shift circuit. In this event, the level shift circuit produces different voltages in accordance with each mode of a writing mode, an erasing mode and a reading mode as the control signal.

For instance, the memory cell is a flash memory. In this case, a negative voltage is applied to the flash memory in the writing mode.

More specifically, the reducing means reduces the PN junction voltage of the transistor of the row main decoder in the writing mode.

Therefore, even when the applied voltage to be applied to the memory cell is a negative voltage, the breakdown level of the PN junction can be reduced.

In consequence, two additional steps (namely, the step for forming the thin p-type diffusion layer and a step for forming the thin n-type diffusion layer) are unnecessary in the manufacturing step of the semiconductor memory device. As a result, the increase of the manufacturing cost can be prevented. Thereby, the manufacturing cost can be largely reduced.

Moreover, the row main decoder is composed of level shift circuits of a plurality of stages in which the mode switching signals are different to each other, and the output signals XB, $\overline{XB}$ becomes the binary signals [0V, −9 V].

Thereby, the voltage applied to the PN junction of the transistor constituting the level shift circuit is further reduced in the writing mode. Consequently, the breakdown level of the PN junction can be further reduced.

BRIEF DESCRIPTION OF THE DRAWINGS

FIG. 2 is a table showing each voltage of each terminal in each mode of a row decoder illustrated in FIG. 1;

FIG. 5 is a table showing each voltage of each terminal in each mode of a row decoder illustrated in FIG. 4;

FIG. 7 is a table showing each voltage of each terminal in each mode of a row decoder illustrated in FIG. 6.

DESCRIPTION OF THE PREFERRED EMBODIMENT

First Embodiment

Description will be first made about a semiconductor memory device according to a first embodiment of this invention.

Figure 1:
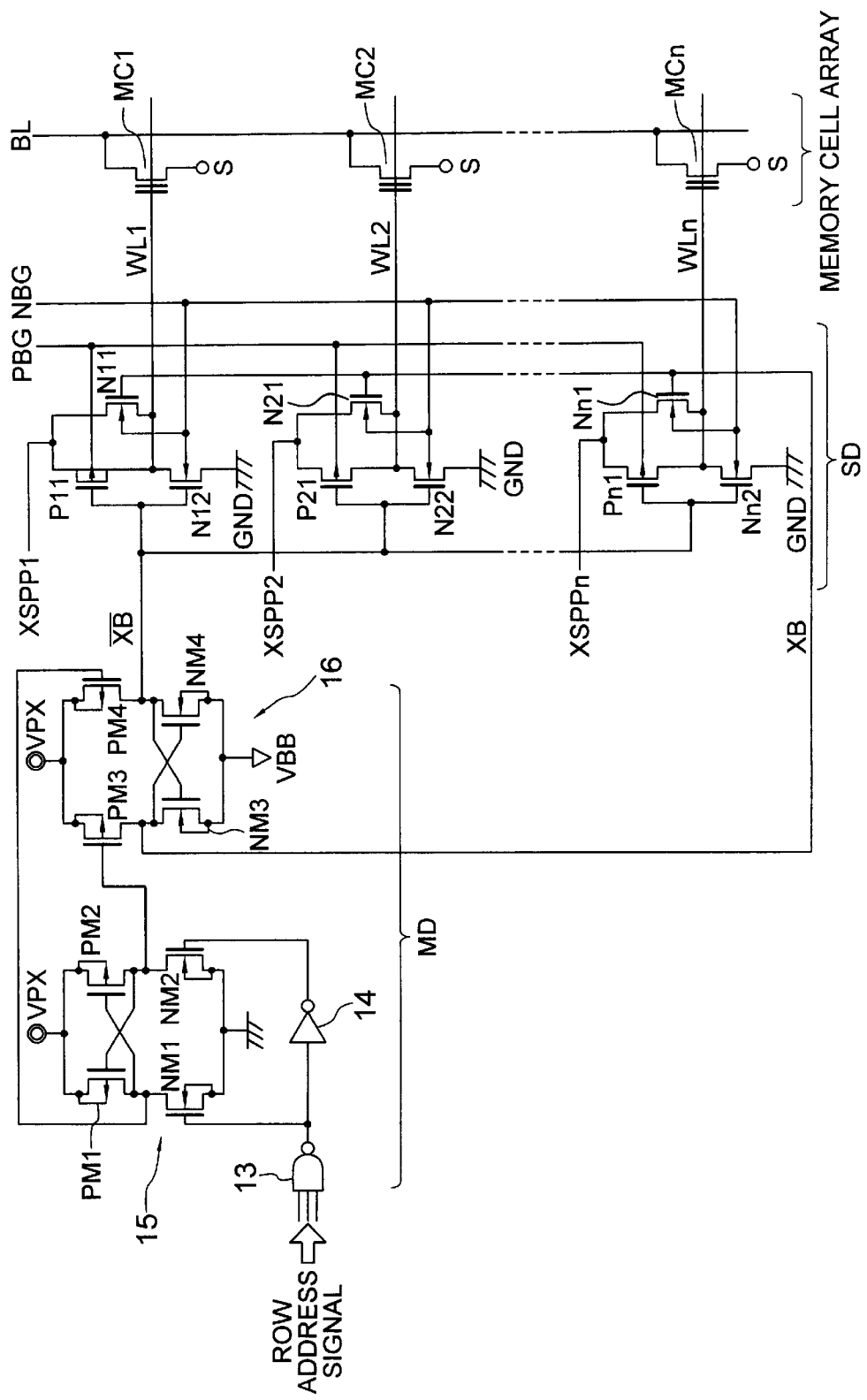
FIG. 1 is a circuit diagram showing a row decoder of a related semiconductor memory device.
Figure 3:
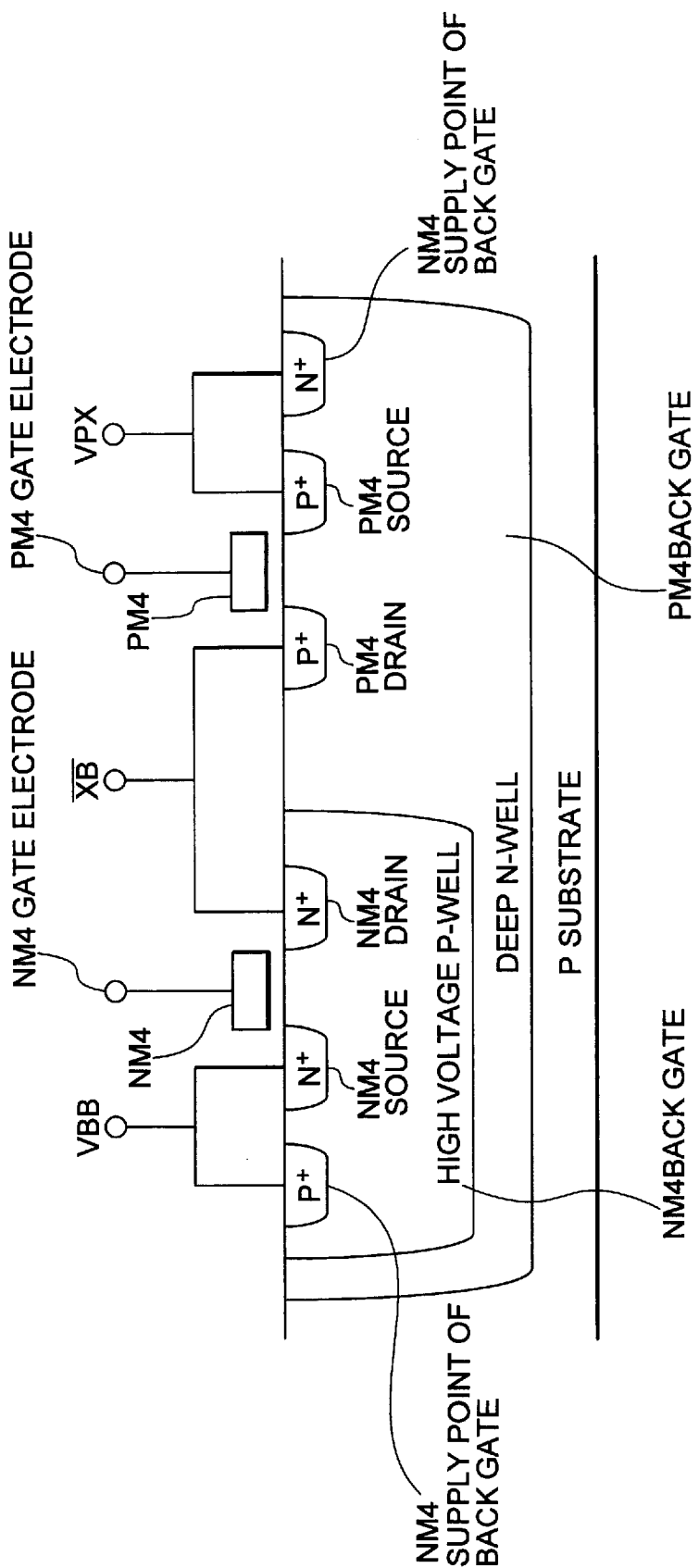
FIG. 3 is a sectional view showing an example of a transistor constituting a row main decoder illustrated in FIG. 1.
Figure 4:
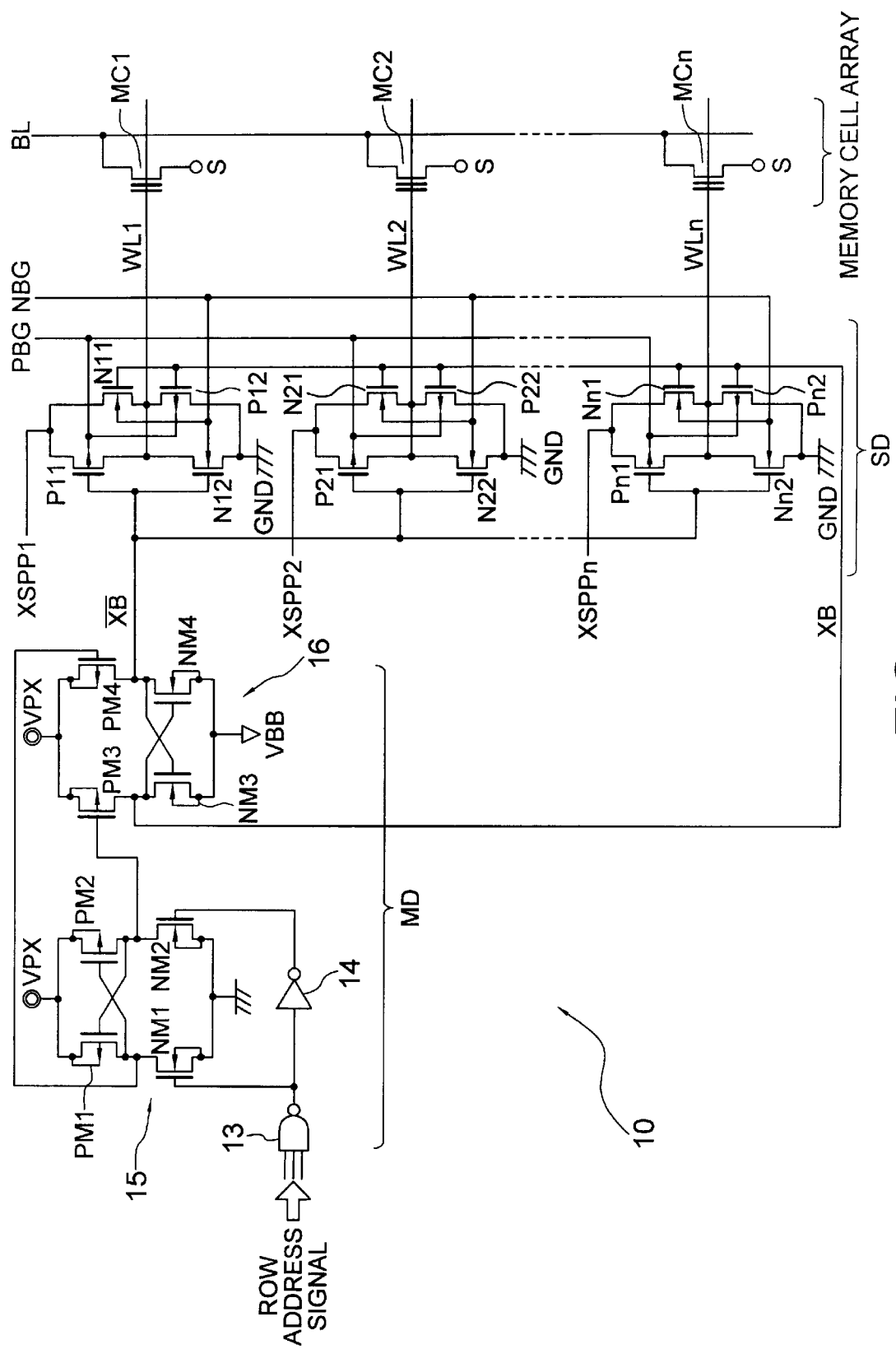
FIG. 4 is a circuit diagram showing a row decoder of a semiconductor memory device according to a first embodiment of this invention.

As illustrated in FIG. 4, a row decoder RD10 arranged in a semiconductor memory device, such as, a flash memory or an EEPROM (Electrically Erasable Programmable ROM), includes a plurality of memory cells MC1–MCn, row sub-decoders (namely, word line driving circuits) SD, and a plurality of row main decoders MD. Herein, it is to be noted that only one decoder MD is illustrated in FIG. 4 for convenience.

In this event, the each memory cell MC1–MCn is electrically writable and erasable, and the each row sub-decoder SD selects a row of each memory cell MC1–MCn. Further, each row main decoder MD decodes a row address signal and supplies output signals XB, $\overline{XB}$ to the row sub-decoders SD.

In this case, the row main decoder is composed of level shift circuits 15, 16, and the output signals XB and $\overline{XB}$ thereof are complementary to each other.

Herein, a memory cell array is structured by a plurality of memory cells arranged in a matrix form. With such a structure, a plurality of word lines WL are connected to control gates of the respective memory cells arranged in a row direction while a plurality of bit lines BL are connected to drains of the respective memory cells arranged in the row direction. In this event, a plurality of word lines WL are divided into some blocks, and each block is selected by one of the row main decoders MD.

The row sub-decoder SD corresponding to the word line WL1 is composed of two p-channel transistors P11, P12 and two n-channel transistors N11, N12.

In this case, sources of the transistor P11 and the transistor N11 are connected to an XSPP node which is given a pre-decode signal (XSPP) while sources of the transistor N12 and transistor P12 are coupled to a ground terminal (GND).

Drains of the respective transistors P11, P12, N11, N12 are connected to the word line (WL). Further, the output signal $\overline{XB}$ is given to gates of the transistor P11 and the transistor N12 while the output signal XB is given to gates of the transistor N11 and the transistor P12.

Moreover, back gates of both the transistor P11, P12 are connected to a back gate voltage (PBG) node while back gates of the both transistors N11, N12 are connected to a back gate voltage (NBG) node, respectively.

Therefore, the p-channel transistor P12 serves as a transfer gate connected between the word line (WL) and the ground potential node.

Each of the row sub-decoders for driving the other memory cells MC2–MCn is structured by the respective transistors Pn1, Pn2, Nn1, Nn2 in the same manner. These row sub-decoders are controlled by the pre-decode signals XSPPn and the output signals XB, $\overline{XB}$ to determine potential of each of the word lines (WL).

The row main decoder MD is composed of a NAND gate 13 which decodes a row address signal, an inverter circuit 14 which converts an output of the NAND gate 13, a first level shift circuit 15 which shifts a level of an output of the NAND gate 13, and a second level shift circuit 16 which shifts an output level of the first level shift circuit 15.

A first level shift circuit 15 is composed of two pairs of transistors which are connected between a mode switching power supply (VPX) node and a ground node in series. More specifically, the level shift circuit 15 is composed of a p-channel transistor PM1 and an n-channel transistor NM1, and a p-channel transistor PN2 and an n-channel transistor NM2.

With such a structure, an output of a NAND gate 13 is given to a gate of the transistor NM1 while an output of an inverter circuit 14 is given to a gate of the transistor NM2. Further, a series connection point between the transistor PM1 and the transistor NM1 is coupled to a gate of the transistor PM2 while a series connection point between the transistor PM2 and the transistor NM2 is coupled to a gate of the transistor PM1.

With this structure, the first level shift circuit 15 converts the binary signal of [0V, VDD] as the output of the NAND gate 13 into the binary signal [0V, VPX].

On the other hand, a second level shift circuit 16 is composed of two pairs of transistors which are connected between a VPX node and a mode switching power supply voltage (VBB) at a low potential side in series. More specifically, the second level shift circuit 16 is composed of a transistor PM3 and a transistor NM3, and a transistor PM4 and a transistor NM4.

With this structure, the output is given to the gate of the transistor PM3 from a series connection point between the transistor PM2 and the transistor NM2. Further, the output is given to the gate of the transistor PM4 from a series connection point between the transistor PM1 and the transistor NM1.

Moreover, a series connection point between the transistor PM3 and the transistor MM3 is connected to the gate of the transistor NM4 while a series connection point between the transistor PM4 and the transistor NM4 is connected to the gate of the transistor NM3.

With this structure, the second level shift circuit 16 converts the binary signal of [0V, VPX] as the output of the first level shift circuit 15 into the binary signal of [VBB, VPX].

The output signal XB is produced from the series connection point between the transistor PM3 and the transistor NM3 of the second level shift circuit 16 while the output signal $\overline{XB}$ is produced from the series connection point between the transistor PM4 and the transistor NM4. In this event, the output signals XB and $\overline{XB}$ are in the complementary relationship.

In this case, each voltage of each terminal in each operation mode of the low decoder MD, SD illustrated in FIG. 4 is represented in FIG. 5.

Herein, it is assumed that the row main decoder MD illustrated in FIG. 4 is selected by the row address to select the word line WL1, and the word lines WL2–WLn and the row main decoders MD (not shown) are not selected.

With this example, description will be made about an operation of the row decoder MD, SD illustrated in FIG. 4.

In the writing operation, the mode switching power supply voltage VPX and the mode switching power supply voltage VBB of the low potential is equal to a supply voltage VDD and −9 V, respectively, as illustrated in FIG. 5. Further, the back gate voltage PBG of the p-channel transistor is equal to 0V while the back gate voltage NBG of the n-channel transistor is equal to −9 V.

When the output of the address decoder 13 is put into 0V, the output signal $\overline{XB}$ is put into the supply voltage VDD, and the output signal $\overline{XB}$ is put into −9 V. Further, the pre-decode signal XSPP1 becomes −9 V while XSPP2–n become 0V.

Consequently, the transistor N11, and P21–Pn1 are turned on. As a result, the word line signal WL1 becomes −9 V while all of the word lines WL2–WLn become 0V.

In this event, the pre-decode signal XSP1 of the memory block (not shown), which is not selected, becomes −9 V. However, the output of the address decoder 13 becomes VDD, the output signal XB becomes −9 V, and the output signal $\overline{XB}$ becomes the supply voltage VDD.

Consequently, the transistors P12–Pn2 are turned on, and the word line signals WL1–WLn of non-selective blocks becomes 0V. In this case, when VDD exceeds NBG (VDD>NBG), the transistors N12–Nn2 are also turned on.

During the erasing operation, the mode switching power supply voltage VPX and the back gate voltage PBG is equal to 1 V, respectively. Further, the mode switching power supply voltage VBB at the low potential side and the back gate voltage NBG is equal to 0 V, respectively.

Moreover, the respective pre-decode signals XSPP1–n and the output signal XB are equal to 11 V, respectively while the output signal $\overline{XB}$ is equal to 0 V. As a result, the transistors P11–Pn1 are turned on, and the word line signals WN1–WLn are equal to 11V, respectively.

In this event, the pre-decode signals XSPP1–n of the non-selective memory blocks (not shown) are equal to 11V.

However, the output of the address decoder 13 becomes VDD. Further, the output signal XB becomes 0V, and the output signal $\overline{XB}$ becomes 11V.

Consequently, the transistors N12–Nn2 are turned on, and the word line signals WL1–WLn of the non-selective blocks becomes 0V.

During the reading operation, the mode switching power supply voltage VPX and the back gate voltage PBG is equal to the power supply voltage VDD, respectively. Further, the mode switching power supply voltage VBB at the lower potential side and the back gate voltage NBG are equal to 0V, respectively.

When the output of the address decoder 13 becomes 0 V, the output signal XB becomes the supply voltage VDD and the output signal $\overline{XB}$ becomes 0 V.

Further, the pre-decode signal XSPP1 is put into VDD while XSPP2–n are equal to 0 V, respectively. In consequence, the transistors P11–Pn1 are turned on. Thereby, the word line signal WL1 becomes VDD while WL2–n are equal to 0V, respectively.

In this case, the pre-decode signal XSPP of the non-selective memory blocks (not shown) becomes VDD. However, the output of the address decoder 13 becomes VDD and the output signal XB is equal to 0V. Further, the output signal $\overline{XB}$ is put into the supply voltage VDD.

Consequently, the transistors N12–Nn2 are turned on, and the word line signals WL1–WLn of the non-selective blocks become 0V, respectively.

Thus, the output signals $\overline{XB}$, XB of the row main decoder MD for controlling the word line driving circuit SD becomes the supply voltage VDD at the high level and –9 V at the low level during the writing operation.

Consequently, a voltage of VDD–(–9) is applied to a PN junction of the transistor constituting the low main decoder MD. Thus, the supply voltage falls within the range between 1.8 and 3.6 V, and is reduced with about 1.4 V in comparison with the conventional case.

Namely, the p-channel transistor P12 is added in the row sub-decoder SD. Thereby, the output signal XB is equal to –9 V even when the output signal $\overline{XB}$ is equal to the supply voltage VDD and the n-channel transistor N12 is not turned on. In consequence, the P-channel transistor P12 is turned on and the potential of the word line WL1 can be put into 0V (namely, ground potential).

Herein, it is to be noted that the transistor P12 is necessary in only the writing mode. Although the transistor N12 does not function in the writing mode, the transistor remains because it is necessary in the other modes.

Therefore, even when the applied voltage to be applied to the memory cell MC is negative like the semiconductor memory device, such as, the flash memory according to this invention, a voltage applied to the PN junction of the transistor constituting the row main decoder MD is reduced during the writing mode. Thereby, the breakdown level of the PN junction can be reduced.

In consequence, two additional steps (namely, the step for forming the thin p-type diffusion layer and a step for forming the thin n-type diffusion layer) are unnecessary in the manufacturing step of the semiconductor memory device. As a result, the increase of the manufacturing cost can be avoided.

Specifically, it is assumed that it is possible to reduce the manufacturing cost with about 10% in the semiconductor memory device according to this invention. This serves to largely reduce the manufacturing cost.

Second Embodiment

Subsequently, description will be made about a semiconductor memory device according to a second embodiment of this invention.

Figure 6:
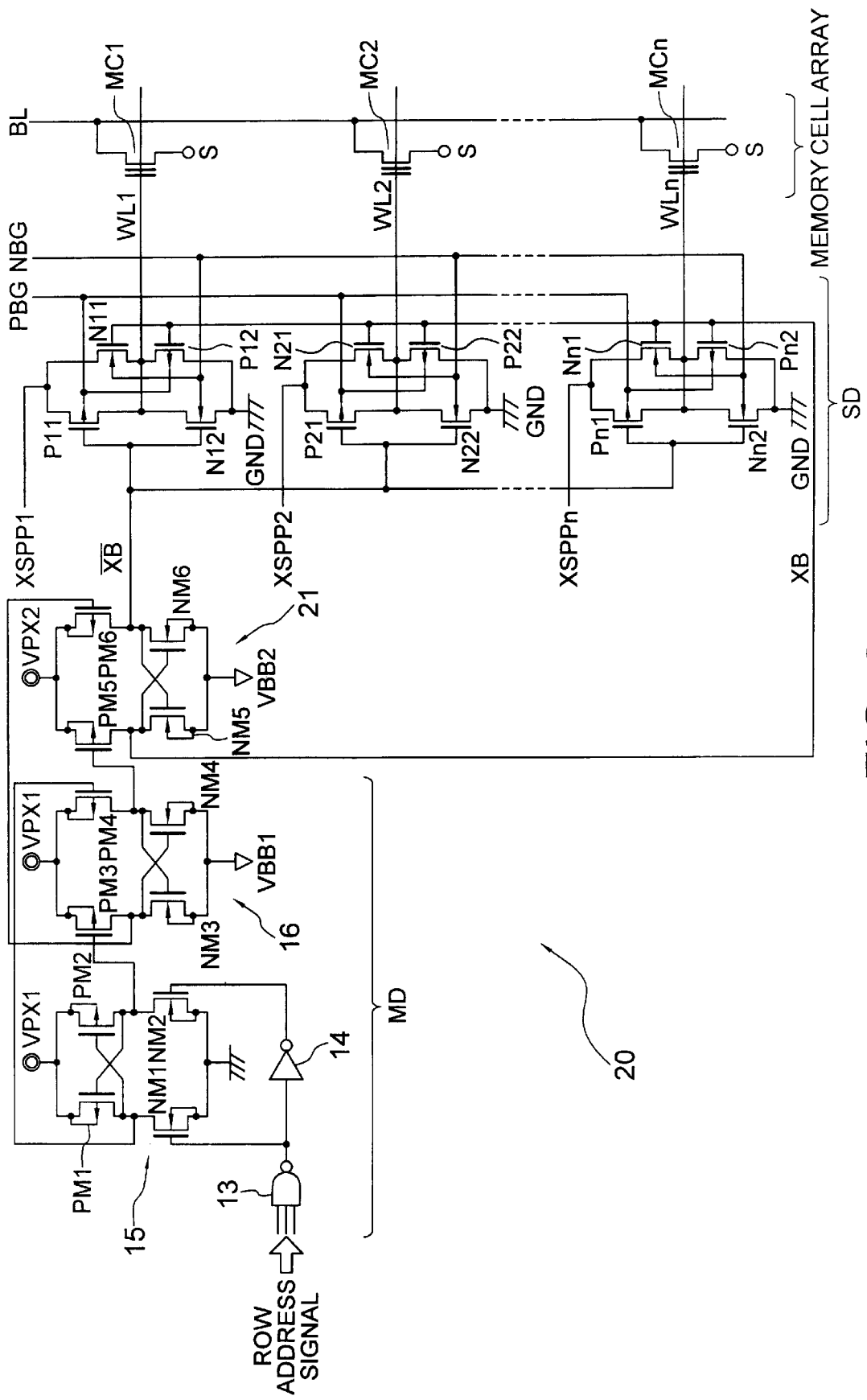
FIG. 6 is a circuit diagram showing a row decoder of a semiconductor memory device according to a second embodiment of this invention.

As illustrated in FIG. 6, a row main decoder MD includes a third level shift circuit 21 in addition to a first level shift circuit 15 and a second level shift circuit 16 in a row decoder RD20. In this event, the third level shift circuit 21 shifts a level of an output of the second level shift circuit 16.

Further, a mode switching power supply voltage VPX2 of the third level shift circuit 21 is different from a mode switching power supply voltage VPX1 of the first and second level shift circuits 15 and 16.

Moreover, a mode switching power supply voltage VBB2 of a lower potential side of the third level shift circuit 21 is different from a mode switching power supply voltage VBB1 of a lower potential side of the second level shift circuit 16.

The row decoder R20 is similar to the row decoder illustrated in FIG. 4 in the other structure, operation and effect.

With this structure, the first level shift circuit 15 converts the binary signal of [0V, VDD] as the output of the NAND gate 13 into the binary signal [0V, VPX]. On the other hand, the second level shift circuit 16 converts the binary signal of [0V, VPX] as the output of the first level shift circuit 15 into the binary signal of [VBB1, VPX1].

The third level shift circuit 21 is composed of two pairs of transistors which are connected between a mode switching power supply (VPX2) node and a mode switching power supply voltage VBB2 node of a low potential side in series. More specifically, the third level shift circuit 21 is composed of a p-channel transistor PM5 and an n-channel transistor NM5, and a p-channel transistor PN6 and an n-channel transistor NM6.

An output is given to a gate of the transistor PM5 from a series connection point between the transistor PM4 and the transistor NM4 of the second level shift circuit 16.

Further, an output is given to a gate of the transistor PM6 from a series connection point between the transistor PM3 and the transistor NM3 of the second level shift circuit 16.

Moreover, a series connection point between the transistor PM5 and the transistor NM5 is coupled to the gate of the transistor NM6 while a series connection point between the transistor PM6 and the transistor NM6 is coupled to the gate of the transistor NM5.

With this structure, the third level shift circuit 16 converts the binary signal of [VBB1, VPX1] into the binary signal [VBB2, VPX2].

Under this circumstance, the output signal XB is produced from the series connection point between the transistor PM5 and the transistor NM5 of the third level shift circuit 21 while the output signal $\overline{XB}$ is produced from the series connection point between the transistor PM6 and the transistor NM6. In this event, the output signals XB and $\overline{XB}$ are in the complementary relationship.

In this case, each voltage of each terminal in each operation mode of the low decoder MD, SD illustrated in FIG. 6 is represented in FIG. 7.

Herein, it is assumed that the row main decoder MD illustrated in FIG. 6 is selected by the row address to select the word line WL1, and the word lines WL2–WLn and the row main decoders MD (not shown) are not selected.

With this example, description will be made about an operation of the row decoder MD, SD illustrated in FIG. 6.

In the writing operation, the mode switching power supply voltage VPX1 is equal to the power supply voltage VDD, the mode switching power supply voltage VPX2 is equal to 0V, the mode switching power supply voltage VBB1 of the low potential is equal to −4 V, and the mode switching power supply voltage VBB2 of the low potential is equal to −9V, respectively.

Further, the back gate voltage PBG of the p-channel transistor is equal to 0V while the back gate voltage NBG of the n-channel transistor is equal to −9 V.

When the output of the address decoder 13 becomes 0V, the output signal XB becomes the supply voltage 0V, and the output signal $\overline{XB}$ becomes −9 V. Further, the pre-decode signal XSPP1 becomes −9 V while XSPP2−n become 0V.

Consequently, the transistor N11, and P21−Pn1 are turned on. As a result, the word line signal WL1 becomes −9 V and the word lines WL2−WLn becomes 0V.

In this event, the pre-decode signal XSPP1 of the memory block (not shown), which is not selected, is put into −9 V. However, the output of the address decoder 13 is put into VDD, the output signal XB becomes −9 V, and the output signal $\overline{XB}$ becomes the supply voltage 0V.

Consequently, the transistors P12−Pn2 are turned on, and the word line signals WL1−WLn of non-selective blocks becomes 0V.

During the erasing operation, the mode switching power supply voltage VPX1, VPX2 and the back gate voltage PBG are equal to 11 V, respectively. Further, the mode switching power supply voltage VBB1, VBB2 at the low potential side and the back gate voltage NBG are equal to 0 V, respectively.

Moreover, the respective pre-decode signals XSPP1−n and the output signal XB are equal to 11 V, respectively while the output signal $\overline{XB}$ is equal to 0 V. As a result, the transistors P11−Pn1 are turned on, and all of the word line signals WN1−WLn are equal to 11V, respectively.

In this event, the pre-decode signals XSPP1−n of the non-selective memory blocks (not shown) are equal to 11V. However, the output of the address decoder 13 becomes VDD. Further, the output signal XB becomes 0V, and the output signal $\overline{XB}$ becomes 11V.

Consequently, the transistors N12−Nn2 are turned on, and all of the word line signals WL1−WLn of the non-selective blocks becomes 0V.

During the reading operation, the mode switching power supply voltage VPX1, VPX2 and the back gate voltage PBG are equal to the power supply voltage VDD, respectively. Further, the mode switching power supply voltage VBB1, VBB2 at the lower potential side and the back gate voltage NBG are equal to 0V, respectively.

When the output of the address decoder 13 is put into 0 V, the output signal XB becomes the supply voltage VDD and the output signal $\overline{XB}$ becomes 0 V. Further, the pre-decode signal XSPP1 becomes VDD while XSPP2−n are equal to 0 V, respectively.

In consequence, the transistors P11, N21−Nn1 are turned on. Thereby, the word line signal WL1 becomes VDD while WL2−n are equal to 0V, respectively.

In this case, the pre-decode signal XSPP1 of the non-selective memory blocks (not shown) becomes VDD. However, the output of the address decoder 13 is put into VDD and the output signal XB is equal to 0V. Further, the output signal $\overline{XB}$ becomes the supply voltage VDD.

Consequently, the transistors N12−Nn2 are turned on, and all of the word line signals WL1−WLn of the non-selective blocks become 0V, respectively.

Thus, the output signals XB, $\overline{XB}$ of the row main decoder MD for controlling the word line driving circuit SD becomes the supply voltage 0V at the high level and −9 V at the low level during the writing operation.

Consequently, a voltage of 0−(−9)=9 is applied to a PN junction of the transistor constituting the low main decoder MD, and is reduced with about 5V in comparison with the conventional case. Actually, 11 V is applied thereto in the erasing operation. As a result, (14+α) V becomes (11+α) V, and is reduced with about 3 V Therefore, in the second embodiment, the voltage applied to the PN junction of the transistor constituting the row main decoder MD is further reduced in the writing mode as compared to the first embodiment. Thereby, the breakdown voltage of the PN junction can be further reduced.

In the meanwhile, it is to be noted that each of the n-channel transistor N12 and the p-channel transistor P12 is not limited to one, two or more may be arranged in the above-mentioned embodiments.

What is claimed is:

1. A semiconductor memory device, comprising:
   a plurality of memory cells which are arranged in a matrix form;
   a row sub-decoder which selects each row of said memory cells;
   a row main decoder which decodes a row address signal and supplies a control signal into said row sub-decoder, said row main decoder being structured by at least on transistor having a PN junction breakdown voltage; and
   a reducing circuit to reduce the PN junction voltage during a writing mode.

2. A device as claimed in claim 1, wherein:
   each of said memory cells is electrically writable and erasable.

3. A device as claimed in claim 1, wherein:
   a pre-decode signal is given to said row sub-decoder and is supplied to said memory cell via a word line, and
   said reducing circuit sets a potential of the word line to a ground potential.

4. A device as claimed in claim 1, wherein:
   said reducing circuit is placed in said row sub-decoder and comprises a transfer gate, and
   said transfer gate is composed of at least one p-channel transistor.

5. A device as claimed in claim 4, wherein:
   said row sub-decoder has a ground potential node, and said p-channel transistor is connected between the word line and the ground potential node.

6. A device as claimed in claim 5, wherein:
   said p-channel transistor has a source, a drain and a gate, the source is connected to the ground potential node, the drain is connected to the word line.

7. A device as claimed in claim 6, wherein:
   the control signal is given to the gate from said row main decoder.

8. A device as claimed in claim 1, wherein:
   the control signal has predetermined amplitude,
   the predetermined amplitude falls within the range between a zero potential and a negative potential.

9. A device as claimed in claim 1, wherein:
   said row main decoder is composed of at least one level shift circuit,
   said level shift circuit produces different voltages in accordance with each mode of a writing mode, an erasing mode and a reading mode as the control signal.

10. A device as claimed in claim 9, wherein:

said memory cell is a flash memory, a negative voltage is applied to said flash memory in the writing mode.

11. A device as claimed in claim 9, wherein:

said level shift circuit is composed of a plurality of transistors.

12. A device as claimed in claim 1, wherein:

said row sub-decoder includes first and second transistors each of which has a first conductive type, and third and fourth transistors each of which has a second conductive type different from the first conductive type, and the control signal of said row main decoder has a first output signal and a second output signal which are complementary to each other.

13. A device as claimed in claim 12, wherein:

each of said first, second, third and fourth transistor has a source, a drain, and a gate, each drain of said first, second, third and fourth transistors is connected to a word line, a pre-decode signal is given to each source of said first and third transistors, the first output signal is given to said first and fourth transistors, the second output signal is given to said second and third transistors.

14. A device as claimed in claim 12, wherein:

the first conductive type is an n-type while the second conductive type is a p-type.

15. A device claimed in claimed 12, wherein:

each of said first and second transistors has a first back gate while each of each of said third and fourth transistors has a second back gate, said row sub-decoder has first and second back gate control nodes, and the first back gates are coupled to the first back gate control node while the second back gates are coupled to the second back gate node.

* * * * *